United States Patent
Spory

(10) Patent No.: US 10,460,326 B2
(45) Date of Patent: Oct. 29, 2019

(54) COUNTERFEIT INTEGRATED CIRCUIT DETECTION BY COMPARING INTEGRATED CIRCUIT SIGNATURE TO REFERENCE SIGNATURE

(71) Applicant: Erick Merle Spory, Colorado Springs, CO (US)

(72) Inventor: Erick Merle Spory, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 122 days.

(21) Appl. No.: 15/792,448

(22) Filed: Oct. 24, 2017

(65) Prior Publication Data

US 2019/0122227 A1   Apr. 25, 2019

(51) Int. Cl.
| | |
|---|---|
| *G06Q 30/00* | (2012.01) |
| *H05K 1/02* | (2006.01) |
| *G01R 31/28* | (2006.01) |
| *G01R 31/317* | (2006.01) |

(52) U.S. Cl.
CPC ..... *G06Q 30/0185* (2013.01); *G01R 31/2815* (2013.01); *G01R 31/2839* (2013.01); *G01R 31/31703* (2013.01); *H05K 1/0275* (2013.01)

(58) Field of Classification Search
CPC .......... G06Q 30/0185; G01R 31/31703; G01R 31/2815; G01R 31/2839; H05K 1/0275
See application file for complete search history.

(56) References Cited

U.S. PATENT DOCUMENTS

| | | | |
|---|---|---|---|
| 3,573,618 A * | 4/1971 | Dilley | G01R 13/208 |
| | | | 324/121 R |
| 3,995,154 A | 11/1976 | Schlick et al. | |
| 4,129,826 A * | 12/1978 | Mills | G01R 31/00 |
| | | | 324/606 |
| 4,152,644 A | 5/1979 | Lockhart, Jr. | |
| 4,456,880 A | 6/1984 | Warner et al. | |
| 4,774,456 A | 9/1988 | Miller | |
| 4,818,934 A * | 4/1989 | Tamamura | G01R 31/2603 |
| | | | 324/762.08 |
| 5,012,074 A | 4/1991 | Masada | |
| 5,495,180 A * | 2/1996 | Huang | G01R 1/04 |
| | | | 324/73.1 |
| 5,663,075 A | 9/1997 | Robinson | |
| 5,804,487 A | 9/1998 | Robinson | |
| 6,111,767 A | 8/2000 | Handleman | |
| 6,339,538 B1 | 1/2002 | Handleman | |
| 6,526,511 B1 | 2/2003 | Urano et al. | |

(Continued)

OTHER PUBLICATIONS

"Counterfeit integrated circuits: Detection, avoidance, and the challenges ahead", by Ujjwal Guin, Daniel DiMase, and Mohammad Tehranipoor, downloaded Oct. 5, 2016 from http://www.engr.uconn.edu/~tehrani/publications/ietta14-2.pdf.

(Continued)

*Primary Examiner* — Naum Levin
(74) *Attorney, Agent, or Firm* — Thomas J. Lavan

(57) ABSTRACT

A method is provided. The method includes connecting an integrated circuit to a curve tracer, displaying a device signature corresponding to the integrated circuit on a screen of the curve tracer, and comparing the device signature to a reference signature to determine if the integrated circuit is counterfeit.

16 Claims, 6 Drawing Sheets

(56) References Cited

U.S. PATENT DOCUMENTS

| | | |
|---|---|---|
| 6,952,775 B1 | 10/2005 | Miura |
| 7,272,760 B2 | 9/2007 | Tan et al. |
| 7,453,281 B2 | 11/2008 | Anderson et al. |
| 7,552,333 B2 | 6/2009 | Wheeler et al. |
| 7,558,965 B2 | 7/2009 | Wheeler et al. |
| 7,580,144 B2 * | 8/2009 | Wadley ............... B41J 2/17543 358/1.15 |
| 7,610,632 B2 | 10/2009 | Higuchi |
| 7,877,712 B2 | 1/2011 | Anderson et al. |
| 8,188,760 B2 | 5/2012 | Patterson |
| 8,376,236 B2 | 2/2013 | Ozawa et al. |
| 8,781,118 B1 | 7/2014 | Pedersen |
| 8,781,770 B2 | 7/2014 | Shen et al. |
| 8,950,008 B2 | 2/2015 | Fainstein et al. |
| 8,978,976 B2 * | 3/2015 | Seo ........................ G06K 5/00 235/380 |
| 9,016,568 B2 | 4/2015 | Wakao et al. |
| 9,165,133 B2 | 10/2015 | La Fever et al. |
| 9,178,859 B1 | 11/2015 | Ortiz et al. |
| 9,244,791 B2 * | 1/2016 | Hamilton ............... G06F 11/24 |
| 9,298,950 B2 | 3/2016 | Fainstein et al. |
| 9,568,540 B2 * | 2/2017 | Robertazzi ......... G01R 31/2607 |
| 9,959,430 B2 * | 5/2018 | Hamilton ............... G06F 21/73 |
| 10,060,973 B1 * | 8/2018 | Helinski ............ G01R 31/2856 |
| 10,094,874 B1 * | 10/2018 | Tangyunyong ...... G01R 31/307 |
| 10,114,369 B2 * | 10/2018 | Newell ............ G05B 19/41875 |
| 10,310,008 B2 * | 6/2019 | Federley ............ G01R 31/2839 |
| 2004/0150383 A1 * | 8/2004 | Blais ................. G01R 1/06766 324/73.1 |
| 2008/0169833 A1 | 7/2008 | Anderson et al. |
| 2008/0282206 A1 | 11/2008 | Anderson et al. |
| 2008/0282208 A1 | 11/2008 | Anderson et al. |
| 2010/0144387 A1 * | 6/2010 | Chou ...................... G07D 7/12 455/556.1 |
| 2010/0241864 A1 | 9/2010 | Kelley et al. |
| 2012/0226463 A1 * | 9/2012 | Keller, III ............ H01L 23/576 702/117 |
| 2013/0287267 A1 | 10/2013 | Varone |
| 2014/0103344 A1 | 4/2014 | Tehranipoor et al. |
| 2014/0258156 A1 | 9/2014 | Tziazas et al. |
| 2015/0067422 A1 * | 3/2015 | Hamilton ................ G06F 11/24 714/724 |
| 2015/0078518 A1 | 3/2015 | Tziazas et al. |
| 2015/0219714 A1 | 8/2015 | Hamilton et al. |
| 2015/0269592 A1 | 9/2015 | Hieftje et al. |
| 2016/0006735 A1 | 1/2016 | La Fever et al. |
| 2016/0282394 A1 * | 9/2016 | House ................. G06K 9/6276 |
| 2017/0061183 A1 * | 3/2017 | Houston ................ G06K 7/12 |
| 2017/0067961 A1 * | 3/2017 | O'Flynn .......... G01R 31/31703 |
| 2017/0261545 A1 * | 9/2017 | Federley ............ G01R 31/2839 |

OTHER PUBLICATIONS

Tektronix Type 576 History, downloaded Oct. 3, 2016 from http://w140.com/tekwiki/wiki/576.

* cited by examiner

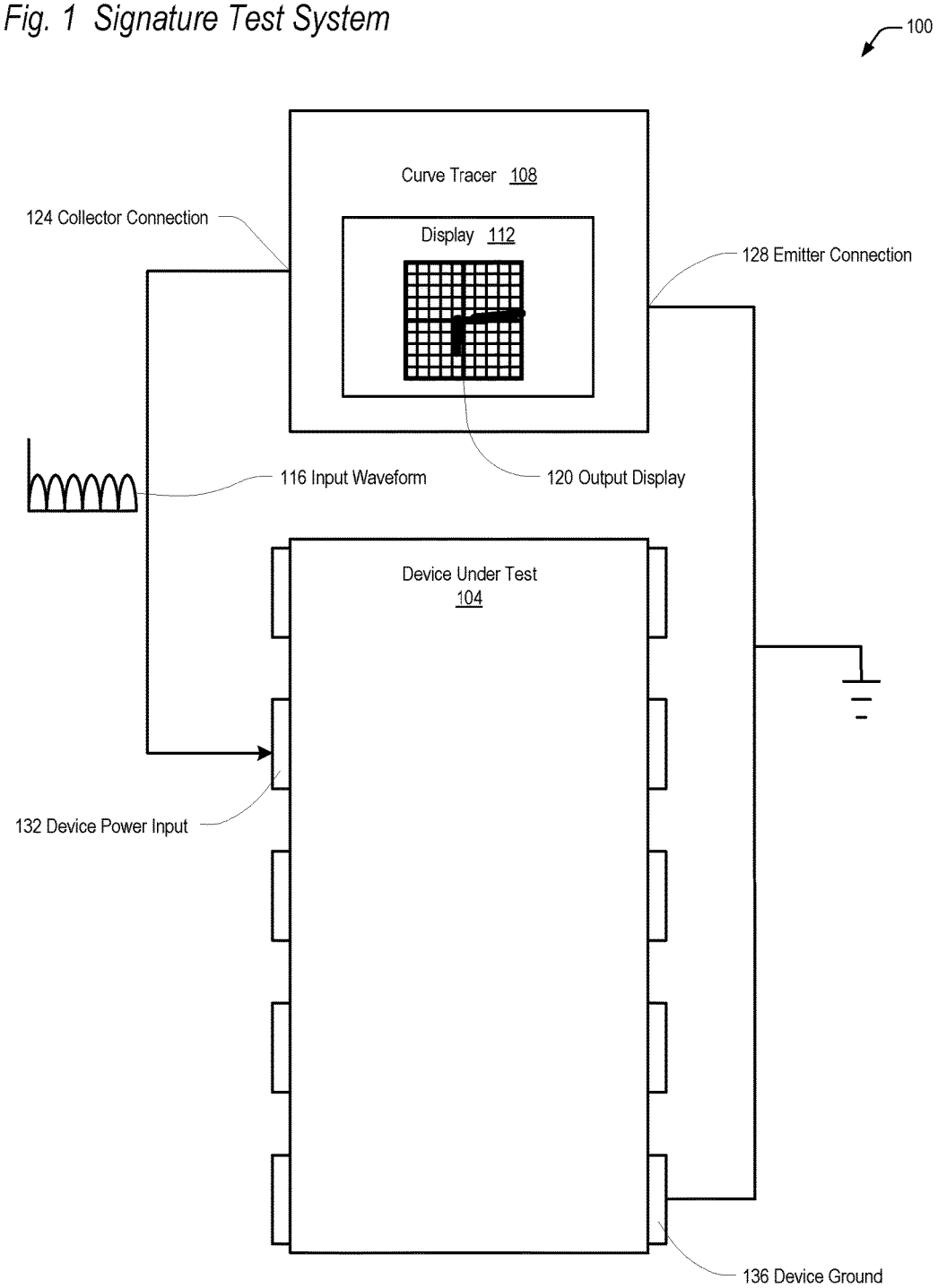

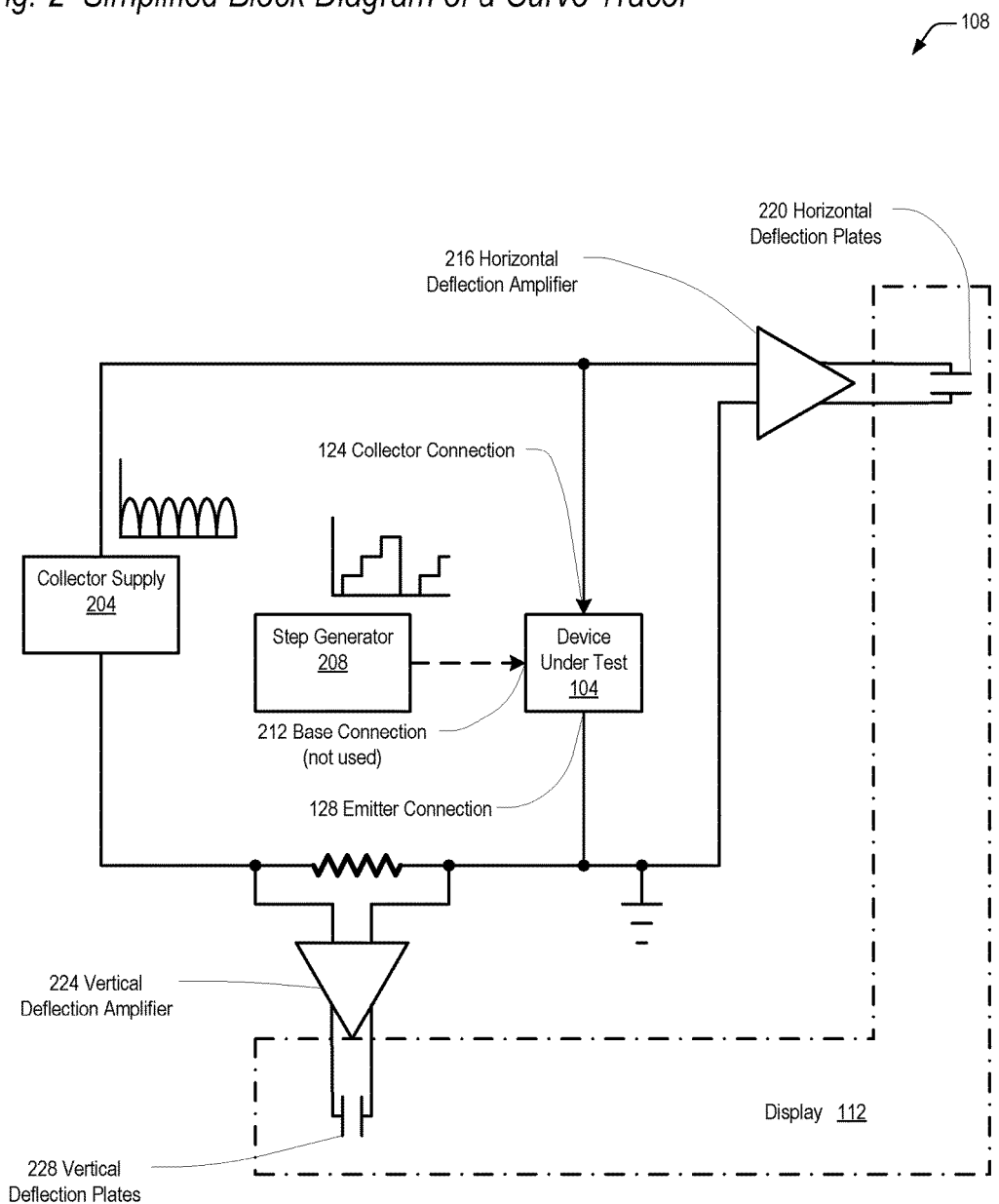
Fig. 2 Simplified Block Diagram of a Curve Tracer

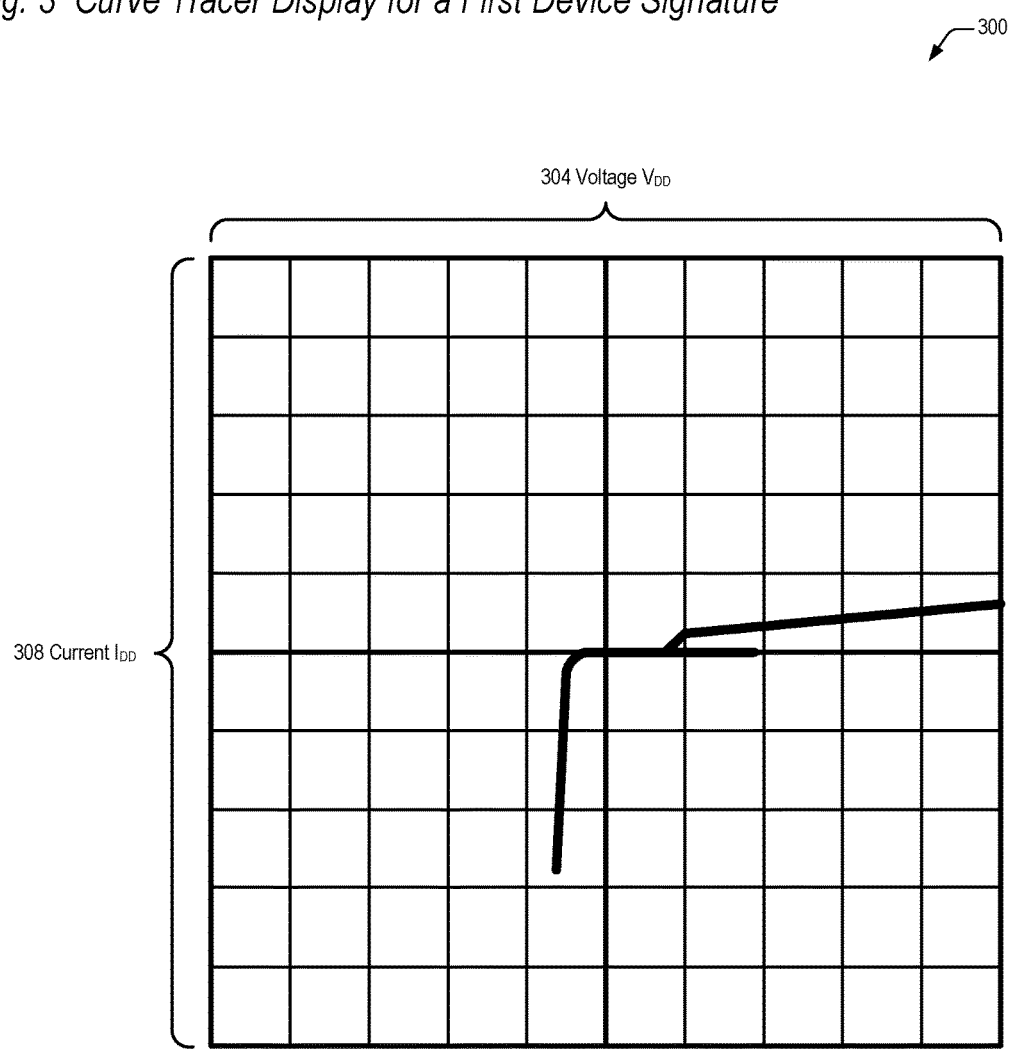
Fig. 3 Curve Tracer Display for a First Device Signature

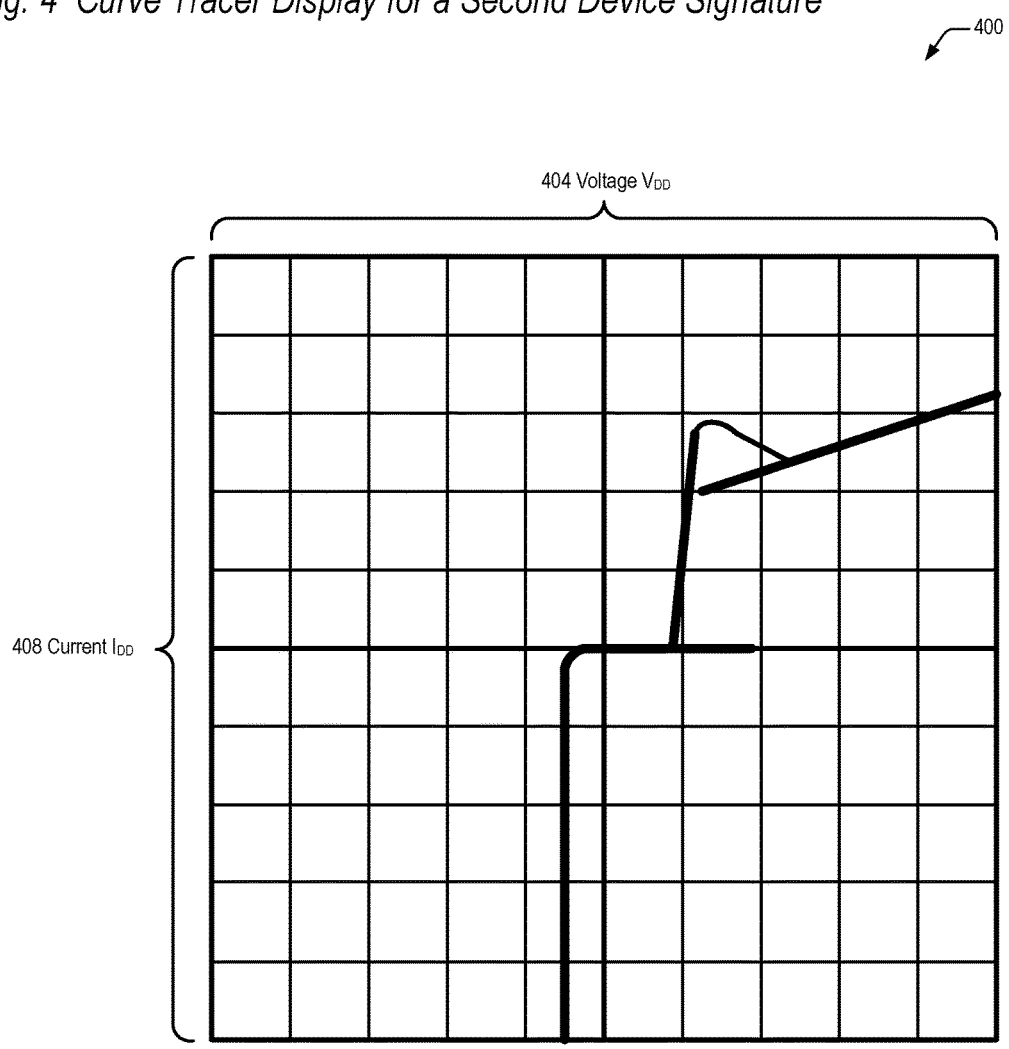
Fig. 4 Curve Tracer Display for a Second Device Signature

Fig. 5 Semiconductor Identification Process
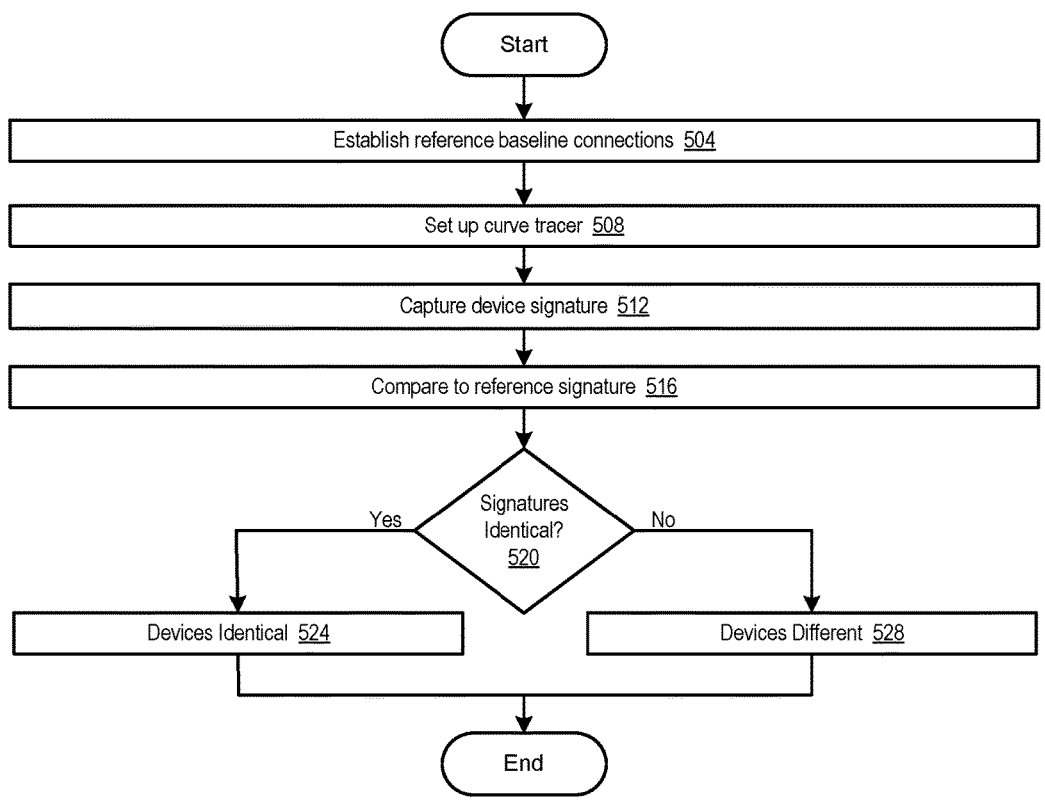

*Fig. 6 Establish Reference Baseline Connections*
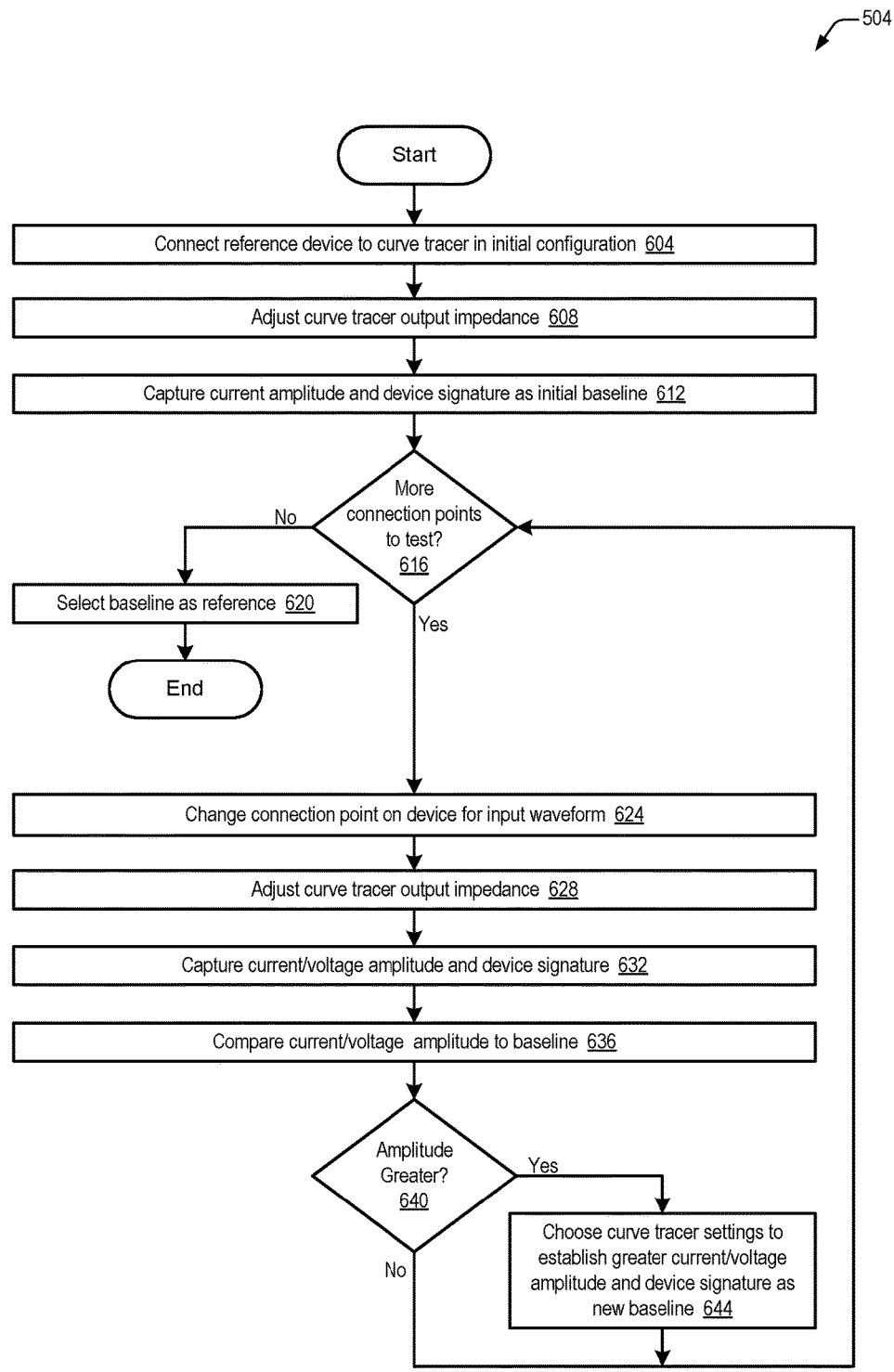

COUNTERFEIT INTEGRATED CIRCUIT DETECTION BY COMPARING INTEGRATED CIRCUIT SIGNATURE TO REFERENCE SIGNATURE

FIELD

The present invention is directed to application methods and systems for counterfeit detection. In particular, the present invention is directed to methods and systems for detecting counterfeit integrated circuits.

BACKGROUND

Counterfeiting and piracy are longstanding problems growing in scope and magnitude. They are of great concern to government and industry because of (i) the negative impact they can have on innovation, economic growth, and employment, (ii) the threat they pose to the welfare of consumers, (iii) the substantial resources that they channel into criminal networks, organized crime, and other groups that disrupt and corrupt society, and finally, (iv) the loss of business from the trade in counterfeits.

Innovation in the business sector has always been the main driver of economic growth, through the development and implementation of ideas for new products and processes. These inventions are usually protected via patents, copyrights, and trademarks. However, without adequate protection of these intellectual property (IP) rights, the incentives to develop these new ideas and products would be considerably reduced, thereby weakening critical thinking and the innovation process. These risks are particularly high for those industries in which the research and development (R&D) costs associated with the development of new products are very high compared to the cost of producing the resulting products. In the world of electronics, the R&D costs for the semiconductor industry are especially high, and protection of their IP rights is of the utmost importance.

Counterfeiting of integrated circuits has become a major challenge due to deficiencies in the existing test solutions and lack of effective avoidance mechanisms in place. Over the past couple of years, numerous reports have pointed to the counterfeiting issues in the US electronics component supply chain. A Senate Armed Services public hearing on this issue and its later report clearly identified this as a major issue to address because of its significant impact on reliability and security of electronic systems. As the complexity of the electronic systems, along with the ICs used in them, has increased significantly over the past few decades, they are assembled (fabricated) globally to reduce the production cost. For example, large foundries located in different countries can offer lower prices to the design houses. This globalization leads to an illicit market willing to undercut the competition with counterfeit parts. If these parts end up in critical applications like defense, aerospace, or medical systems, the results could be catastrophic.

SUMMARY

In accordance with embodiments of the present invention, a method is provided. The method includes connecting an integrated circuit to a curve tracer, displaying a device signature corresponding to the integrated circuit on a screen of the curve tracer, and comparing the device signature to a reference signature to determine if the integrated circuit is counterfeit.

In accordance with another embodiment of the present invention, a system is provided. The system includes a reference device, an integrated circuit, and a curve tracer comprising a screen to display device signatures. After obtaining a reference signature from the reference device, the integrated circuit is connected to the curve tracer in order to display a device signature on the screen. The device signature is compared to the reference signature in order to determine if the integrated circuit is counterfeit.

An advantage of the present invention is it provides a method for determining if semiconductor devices are counterfeit. Lot variations do not generally produce different device signatures, and therefore reliable testing may be performed without regard to lot.

Another advantage of the present invention is it provides a fast and non-destructive method to determine if semiconductor devices are counterfeit or not. Setup time is minimal and devices may be operationally used following testing.

Yet another advantage of the present invention is it provides for a fundamental examination of the device for obvious defects or failures causing dramatically increased or decreased power draw.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating a Signature Test System in accordance with embodiments of the present invention.

FIG. 2 is a diagram illustrating a simplified block diagram of a curve tracer in accordance with embodiments of the present invention.

FIG. 3 is a diagram illustrating a curve tracer display for a first device signature in accordance with embodiments of the present invention.

FIG. 4 is a diagram illustrating a curve tracer display for a second device signature in accordance with embodiments of the present invention.

FIG. 5 is a flowchart illustrating a Semiconductor Identification Process in accordance with embodiments of the present invention.

FIG. 6 is a flowchart illustrating an Identify Input/Output Connections Process in accordance with embodiments of the present invention.

DETAILED DESCRIPTION

The present invention is directed to methods and systems for detecting counterfeit integrated circuits. Previous application methods for detecting counterfeit integrated circuits have involved various forms of physical inspections, electrical inspections, and functional inspections.

Physical methods generally entail the inspection of the physical structure and the material analysis of a component. The major challenges for the implementation of physical inspections are most physical tests are destructive, high test time and cost, a general lack of automation, and a general lack of physical inspection metrics.

With regard to electrical methods, parametric tests are generally very time efficient. However, due to increased process variations and environmental variations (temperature, noise, aging, etc.), the electrical parameters of a component may vary significantly. It can be very difficult to conclude whether the variations in the parameters of a component are due to aging (for recycled and remarked components) or process variations in the circuit. One can perform a statistical analysis based on the data observed from the parametric tests to determine the confidence level that a part is counterfeit with or without a "golden" or reference IC. The efficiency of such analysis must be proven on a large number of reference and counterfeit parts.

With regard to functional methods, test program generation for obsolete and active parts with limited knowledge of the part will be extremely difficult, if not impossible. The requirement of having a high-speed tester in order to apply functional test patterns to chips make it extremely expensive. It is nearly impossible to get the complete set of test vectors for an obsolete part from the original manufacturer. In some cases, the original manufacturer may no longer exist or the information required may no longer be available in archived records. Burn-in tests are useful in detecting infant mortality failures of components. However, because of excessive test time and cost, these tests are only attractive and useful only for critical and high-risk applications. The implementation of structural tests in counterfeit detection is extremely challenging for several reasons. First, the structural tests require total access to internal scan chains of a component. Sometimes, IP owners do not give permission to access their design and disable the internal scan chains with a fuse. Second, obsolete parts may not have design for testability (DFT) structures implemented.

Therefore what is needed is a highly reliable test that eliminates variances due to different lots of integrated circuits while clearly identifying mask or other differences between reference components and potentially counterfeited devices.

Referring now to FIG. 1, a diagram illustrating a Signature Test System 100 in accordance with embodiments of the present invention is shown. Signature test system 100 includes a device under test 104, which is any semiconductor device including transistors and all forms of analog and digital integrated circuits. Device under test 104 includes at least two connections to outside circuitry, and the present invention utilizes two connections to each device under test 104.

Signature test system 100 also includes a curve tracer 108 equipment, which allows display and measurement of characteristic curves of a variety of semiconductor devices. In the preferred embodiment, the curve tracer 108 is a TEKTRONIX INC. Type 576 curve tracer. Curve tracers 108 utilize either grounded emitter or grounded base configurations in order to allow a variety of possible measurements. The curve tracer 108 includes a display screen 112, which displays characteristic UV (current versus voltage) curves of the device under test 104. Curve tracer 108 interfaces to device under test 104 with a collector connection 124, which generates input waveform 116. Curve tracer 108 also interfaces to device under test 104 using emitter connection 128, which provides output display 120.

Curve tracers 108 have traditionally been used to observe breakdown voltages, transistor gains, and other design parameters of semiconductor devices. When utilized for counterfeit detection, curve tracers 108 generally do not indicate lot differences between devices as long as the manufacturer, part type, layout, and the process remain the same.

Referring now to FIG. 2, a diagram illustrating a simplified block diagram of a curve tracer 108 in accordance with embodiments of the present invention is shown. Curve tracer 108 includes at least a collector supply 204, which generates a 60 Hz fully rectified waveform through the collector connection 124 to the device under test 104 and an internal horizontal deflection amplifier 216. Although curve tracer 108 may include a step generator 208 to a base connection 212 of the device under test 104, in the present invention the step generator 208 and base connection 212 are not used. The 60 Hz fully rectified waveform is generated to the device under test 104 using a variable voltage source, while simultaneously observing the current draw of the device under test 104. The curve tracer 108 has a variable output impedance, and this is varied when connected to the device under test 104 in order to maximize the current amplitude of the device signature displayed on the screen 112. This allows subtle differences between different device signatures to be noted, and when the output impedance is adjusted to produce a maximum current amplitude, the device signature or response is optimized.

The collector supply 204 is resistively coupled to a ground connection, the emitter connection 128 of the device under test 104, and the horizontal deflection amplifier 216. A vertical deflection amplifier 224 is coupled across the resistive load within the curve tracer 108, and drives vertical deflection plates 228 associated with the display 112. The horizontal deflection amplifier 216 drives horizontal deflection plates 220 also associated with the display 112.

Referring now to FIG. 3, a diagram illustrating a curve tracer display for a first device signature 300 in accordance with embodiments of the present invention is shown. The curve tracer display 112 includes horizontal and vertical graticules to actively illustrate UV (current versus voltage) characteristic curves of the device under test 104. The horizontal axis displays a voltage $V_{DD}$ 304 and the vertical axis displays a current $I_{DD}$ 308. In order to accurately view displayed characteristic curves, it is helpful to optimize the displayed device signature in order to differentiate subtle differences between connected devices under test 104 in order to detect counterfeit devices 104. To that end, FIG. 6 and associated description illustrates a process to optimize the displayed device signature or a reference device. For exemplary purposes, the displayed characteristic curve or signature 300 approximately corresponds to a 2706 operational amplifier (Op Amp).

For some devices under test 104, the displayed signature is static, and never changes. For other devices under test 104, there may be one or more areas of the display that indicate oscillation between two or more different shapes. In yet other devices 104 there may be areas of the display that change over time. All of these variations should be noted in order to provide a complete description, and are just as much a part of the displayed signature as static parts of the image.

When considering whether device signatures of a reference device and a device under test 104 are the same or identical, in addition to static and dynamic components of the displayed waveforms, other characteristics including where zero crossings (in both axes) occur, peak amplitudes, and shapes of the waveforms should be considered.

Referring now to FIG. 4, a diagram illustrating a curve tracer display for a second device signature 400 in accordance with embodiments of the present invention is shown. The horizontal axis displays a voltage $V_{DD}$ 404 and the vertical axis displays a current $I_{DD}$ 408. For exemplary purposes, the displayed characteristic curve 400 or signature approximately corresponds to a 2711 operational amplifier (OP Amp).

Referring now to FIG. 5, a flowchart illustrating a Semiconductor Identification Process in accordance with embodiments of the present invention is shown. The semiconductor identification process establishes if a semiconductor device is authentic or counterfeit by comparing a device signature for a device under test 104 to a reference signature. Flow begins at block 504.

At block 504, the user of the signature test system 100 identifies input/output connections of the device under test 104. This is described in more detail with respect to FIG. 6. Flow proceeds to block 508.

At block 508, the curve tracer 108 is set up and configured. Specifically, the collector connection 124 and emitter connection 128 of the curve tracer 108 are connected to the identified input/output connections of the device under test 104, and the output impedance of the curve tracer 108 is set to match the same parameter for a reference device. Flow proceeds to block 512.

At block 512, the device signature 300, 400 is captured on the screen 112 for the device under test 104. Flow proceeds to block 516.

At block 516, the device signature 300, 400 is compared to a reference device signature. The reference device signature has been previously obtained from a device under test 104 in the process of FIG. 6, and may be either a known counterfeit or non-counterfeit device 104. If the reference device is a known counterfeit device, then if the device signature 300, 400 of the device under test 104 matches the reference device signature, the device under test 104 is also a counterfeit device. If the reference device is a known non-counterfeit device, then if the device signature 300, 400 of the device under test 104 matches the reference device signature, then the device under test 104 is not a counterfeit device. Flow proceeds to decision block 520.

At decision block 520, if the reference device signature matches the device signature of the device under test 104, then flow proceeds to block 524. If the reference device signature does not match the device signature of the device under test 104, then flow instead proceeds to block 528.

At block 524, the reference device has been determined, for counterfeit identification purposes, to be identical to the device under test 104. Flow ends at block 524.

At block 528, the reference device has been determined, for counterfeit identification purposes to not be identical to the device under test 104. Flow ends at block 528.

Referring now to FIG. 6, a flowchart illustrating an Establish Reference Baseline Connections Process in accordance with embodiments of the present invention is shown. Prior to testing devices 104, it is necessary to create a reference baseline to compare to the device under test 104. The reference baseline includes identification of a specific power input terminal of the device and an output impedance setting to be used for devices under test 104. Flow begins at block 604.

At block 604, a reference device is connected to the curve tracer 108 in an initial configuration. The reference device is a device having the same device type, manufacturer, manufacturing process, and layout is the device under test 104. As long as the device type, manufacturer, manufacturing process, and layout are the same between the reference device and the device under test 104, nearly identical signatures should be produced for both components. The initial configuration requires identification of a first power input connection and a ground connection for the reference device. Flow proceeds to block 608.

At block 608, if the curve tracer 108 includes a variable output impedance control, the variable output impedance control is adjusted in order to produce a maximum current/voltage amplitude on the screen 112. Flow proceeds to block 612.

At block 612, the maximum current/voltage amplitude and device signature for the reference device are captured as an initial baseline. Captured includes either a screen 112 capture of the displayed device signature, storing an image of the screen 112 capture, or printing out the image of the screen 112 capture. Flow proceeds to decision block 616.

At decision block 616, if there are more connection points of the reference device to test, then flow proceeds to block 624 to test using another connection point for the collector connection 124. If there are not more connection points of the reference device to test, then flow instead proceeds to block 620.

At block 620, there are not more connection points (reference device voltage inputs) for the collector connection 124 to test, and the user of the signature test system 100 selects the current baseline (signature with the greatest current/voltage amplitude among all tested signatures) as the baseline or device signature of the reference device. Flow ends at block 620.

At block 624, the connection point for the collector connection 124 on the device under test is changed by selecting another voltage input of the reference device. Flow proceeds to block 628.

At block 628, if the curve tracer 108 includes a variable output impedance control, the variable output impedance control is adjusted in order to produce a maximum current/voltage amplitude on the screen 112. Flow proceeds to block 632.

At block 632, the reference device maximum current/voltage amplitude and device signature is again captured. Flow proceeds to block 636.

At block 636, the just-captured reference device maximum current/voltage amplitude for the changed connection point is compared to the baseline. Flow proceeds to decision block 640.

At decision block 640, if the maximum current/voltage amplitude for the changed connection point from block 624 is greater than the maximum current/voltage amplitude for the current baseline, then flow proceeds to block 644. If the maximum current/voltage amplitude for the changed connection point from block 624 is not greater than the maximum current/voltage amplitude for the current baseline, then flow proceeds to block 616 to check for additional connection points to test.

At block 644, the user of the signature test system 100 chooses curve tracer settings to establish the greater current/voltage amplitude and corresponding device signature as the new baseline. The first time through the flow of FIG. 6, the changed connection point current/voltage amplitude from block 624 is compared with the maximum current/voltage amplitude for the initial baseline from block 608. For second and subsequent times through the flow of FIG. 6, the changed connection point maximum current/voltage amplitude from block 624 is compared with whatever was the current baseline maximum current/voltage amplitude. Flow proceeds to decision block 616 to check for additional connection points to test.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A method, comprising:
identifying connections between a device under test and a curve tracer to produce an optimal response, comprising:
   selecting initial connections between the device under test and the curve tracer;
   connecting, by the initial connections, the device under test-to the curve tracer;
   displaying an initial device signature corresponding to the device under test;
   selecting different connections, in response to different connections are available, between the device under test and the curve tracer;
   connecting, by the different connections, the device under test to the curve tracer;
   displaying a different device signature corresponding to the device under test;
   repeating selecting different connections, connecting by the different connections, and displaying different device signatures for all possible different connections; and
   selecting one of the initial connections and the different connections that produces the optimal response on the curve tracer;
connecting the device under test to the curve tracer with the identified connections;
displaying a device signature corresponding to the device under test on a screen of the curve tracer; and
comparing the device signature to a reference signature to determine if the device under test is counterfeit.

2. The method of claim 1, wherein the optimal response displays a greatest amplitude of current on the curve tracer when an output impedance control of the curve tracer is adjusted in order to display the greatest amplitude of current.

3. The method of claim 2, wherein the optimal response produces greater amplitude of current in the device signature compared to other connections between the device under test and the curve tracer.

4. The method of claim 2, wherein the optimal response is initially obtained for the reference device prior to obtaining the optimal response for the device under test.

5. The method of claim 2, wherein the same connections for the curve tracer are used for the device under test and the reference device, wherein the same connections comprises a power input and a ground connection on the device under test and reference device.

6. The method of claim 5, wherein the curve tracer comprises base, collector, and emitter connections, wherein only the collector and emitter connections are used to display device signatures, wherein the base connection is unconnected.

7. The method of claim 1, wherein the device under test is counterfeit in response to the device signature does not match the reference signature.

8. The method of claim 7, wherein device signatures match comprises similar shapes of the device signatures and zero crossings on the screen occur at a same output impedance.

9. A system, comprising:
a reference device;
a device under test; and
a curve tracer comprising a screen to display device signatures,
wherein power and ground connections between the device under test and the curve tracer to produce an optimal response are identified, comprising:
   select initial connections comprising a first power connection and a ground connection between the device under test and the curve tracer;
   connect, by the initial connections, the device under test to the curve tracer;
   display an initial device signature that corresponds to the device under test;
   select different connections comprising a power connection other than the first power connection and the ground connection, in response to other power connections other than the first power connection are available, between the device under test and the curve tracer;
   connect, by the different connections, the device under test to the curve tracer;
   display a different device signature corresponding to the device under test;
   repeat select different connections, connect by the different connections, and display different device signatures for all available different connections; and
   select one of the initial connections and the different connections that produces the optimal response on the curve tracer;
wherein a reference signature from the reference device is obtained with the identified power and ground connections, wherein the device under test is connected to the curve tracer in order to display a device signature on the screen, wherein the device signature is compared to the reference signature in order to determine if the device under test is counterfeit.

10. The system of claim 9, wherein the optimal response displays a greatest current amplitude on the curve tracer when an output impedance control on the curve tracer is adjusted to produce the greatest current amplitude.

11. The system of claim 10, wherein the optimal response produces greater current amplitude in the device signature compared to other connections between the device under test and the curve tracer.

12. The system of claim 10, wherein the optimal response is initially obtained for the reference device prior to obtaining the optimal response for the device under test.

13. The system of claim 10, wherein the same connections and output impedance are used for the curve tracer for the device under test and the reference device.

14. The system of claim 13, wherein the curve tracer comprises:
base, collector, and emitter connections,
wherein only the collector and emitter connections are used to display device signatures, wherein the base connection is unconnected.

15. The system of claim 9, wherein the device under test is counterfeit in response to the device signature does not match the reference signature.

16. The system of claim 15, wherein device signatures match comprises similar shapes of the device signatures and zero crossings on the screen occur at a same output impedance.

* * * * *